(12) United States Patent
Hargrove et al.

(10) Patent No.: US 8,048,791 B2
(45) Date of Patent: Nov. 1, 2011

(54) METHOD OF FORMING A SEMICONDUCTOR DEVICE

(75) Inventors: Michael Hargrove, Clinton Corners, NY (US); Richard J. Carter, Hopewell Junction, NY (US); Ying H Tsang, Newburgh, NY (US); George Kluth, Hopewell Junction, NY (US); Kisik Choi, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 279 days.

(21) Appl. No.: 12/390,907

(22) Filed: Feb. 23, 2009

(65) Prior Publication Data

US 2010/0213553 A1  Aug. 26, 2010

(51) Int. Cl.
*H01L 21/3205* (2006.01)
*H01L 21/4763* (2006.01)

(52) U.S. Cl. ......... 438/591; 438/54; 438/59; 257/190; 257/410

(58) Field of Classification Search .......... 438/54, 438/59, 61, 591; 257/190, 410, E21.615
See application file for complete search history.

(56) References Cited

U.S. PATENT DOCUMENTS

| 5,951,757 | A * | 9/1999 | Dubbelday et al. | 117/102 |
| 7,205,586 | B2 * | 4/2007 | Takagi et al. | 257/192 |
| 7,569,869 | B2 * | 8/2009 | Jin et al. | 257/190 |
| 2005/0285098 | A1 * | 12/2005 | Fathimulla et al. | 257/20 |
| 2006/0237803 | A1 | 10/2006 | Zhu et al. | |
| 2010/0184260 | A1 * | 7/2010 | Luo et al. | 438/154 |
| 2010/0197128 | A1 * | 8/2010 | Schaeffer et al. | 438/591 |

OTHER PUBLICATIONS

Chau, Robert, et al. "Application of High-k Gate Dielectrics and Metal Gate Electrodes to Enable Silicon and Non-Silicon Logic Nanotechnology," Microelectronic Engineering, Jun. 2005, pp. 1-6, vol. 80, Issue 1, Elsevier Science Ltd., Oxford UK. ISSN:0167-9317.
Gusev, E.P., et al. "Advanced High-k Dielectric Stacks with PolySi and Metal Gates: Recent Progress and Current Challenges," IBM Journal of Research and Development, Advanced Silicon Technology, Aug. 6, 2006, pp. 387-410, vol. 50, No. 4/5. http://www.research.ibm.com/journal/rd/504/gusev.html.

* cited by examiner

*Primary Examiner* — Phuc Dang
(74) *Attorney, Agent, or Firm* — Ingrassia Fisher & Lorenz, P.C.

(57) ABSTRACT

Methods for forming a semiconductor device comprising a semiconductor substrate are provided. In accordance with an exemplary embodiment, a method comprises forming a channel layer overlying the semiconductor substrate, forming a channel capping layer having a first surface overlying the channel layer, oxidizing the first surface of the channel capping layer, and depositing a high-k dielectric layer overlying the channel capping layer.

17 Claims, 10 Drawing Sheets

METHOD OF FORMING A SEMICONDUCTOR DEVICE

FIELD OF THE INVENTION

The present invention generally relates to semiconductor devices and methods for fabricating semiconductor devices, and more particularly relates to metal oxide semiconductor devices having buried gate channels and methods for fabricating such metal oxide semiconductor devices.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs in which case the IC is referred to as a complementary MOS or CMOS integrated circuit (IC). There is a continuing trend to incorporate more circuitry having greater complexity on a single IC chip. To continue this trend, the size of each individual device in the circuit and the spacing between device elements, or the pitch, is reduced for each new technology generation.

As critical dimensions shrink, device components such as the gate length and the thickness of gate insulator layers are scaled down in substantial proportion with each technology node. At the 65 nm node, conventional gate insulator materials such as, for example, thermally grown silicon dioxide ($SiO_2$) or deposited silicon oxynitride (SiON), begin to exhibit excessive leakage current and thus provide only marginally sufficient electrical isolation between the gate electrode and the underlying channel of a transistor. The problem of excessive leakage current is compounded when metal gate electrodes are used because such electrodes can reduce the oxide, thereby further decreasing its insulating properties. Therefore, alternative materials having dielectric constants greater than about 7 (referred to herein as high-k dielectrics) have been considered for use with advanced devices including advanced CMOS devices. Gate insulators made from high-k dielectrics can be made thicker than those made with $SiO_2$ without sacrificing capacitance, and thus offer the benefit of a significant reduction in leakage current. Candidate materials include transitional metal oxides, silicates, and oxynitrides such as hafnium oxide, hafnium silicate, and hafnium oxynitride.

However, many high-k dielectrics, while offering improved insulating properties, also retain certain negative characteristics that can potentially degrade device performance. For example, high-k dielectrics typically contain metal-oxygen bonds that are polarizable. As a result, when placed under an electric field (such as that applied to a gate electrode), these materials generate remote phonons that can cause charge scattering. Such scattering reduces the mobility of charge carriers in the channel, reducing transistor drive current thereby. In addition, charge trapping at the interface between the channel and the high-k insulator or within the high-k dielectric itself can alter the threshold voltage ($V_t$) of a transistor, rendering its performance inconsistent. Further, such trapped charges can lead to excessive coulomb scattering of channel carriers that can further reduce drive current. These undesirable effects are exacerbated when a high-k gate dielectric is positioned in close proximity to a channel, which often is the case in advanced devices fabricated for the 45 nm technology node and beyond.

Accordingly, it is desirable to provide semiconductor devices having gate channels that are buried by a capping layer interposed between a channel and a high-k gate dielectric. Further it is also desirable to provide methods for fabricating such semiconductor devices. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with exemplary embodiments of the invention, methods for forming a semiconductor device comprising a semiconductor substrate are provided. One exemplary method comprises forming a channel layer overlying the semiconductor substrate, forming a channel capping layer having a first surface overlying the channel layer, oxidizing the first surface of the channel capping layer, and depositing a high-k dielectric layer overlying the channel capping layer.

A method for fabricating a semiconductor device on a semiconductor substrate having a first region and a second region in accordance with another exemplary embodiment of the invention is provided. The method comprises the steps of forming a first semiconductor layer overlying the first region, forming a compressively-stressed semiconductor layer overlying the second region, forming a channel capping layer overlying the first region and the second region, the channel capping layer having a first surface, oxidizing the first surface of the channel capping layer, and depositing a high-k gate insulator layer overlying the channel capping layer.

A semiconductor device having a gate stack overlying a semiconductor substrate in accordance with an exemplary embodiment of the invention is provided. The gate stack comprises a semiconductor channel layer disposed overlying the semiconductor substrate, a silicon-comprising channel capping layer disposed overlying the semiconductor channel layer, and a high-k gate insulator disposed overlying the silicon-comprising channel capping layer.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The various embodiments of the present invention describe methods for fabricating NMOS and PMOS transistors having buried gate channels to enhance carrier mobility in devices using high-k dielectric gate insulators and metal gate electrodes. These methods include forming a surface-oxidized silicon capping layer interposed between a stressed monocrystalline channel and a high-k dielectric gate insulator. The capping layer "buries" the channel by providing a layer of separation between the channel and the overlying high-k dielectric. Separation of these features reduces undesirable effects including those resulting from charge scattering and trapping that may otherwise be manifested when a high-k dielectric is placed in close proximity to a channel. Reduction of charge scattering is known to enhance carrier mobility and drive current, while decreasing the number of interfacial charge trapping sites helps to provide a more stable threshold voltage. By reducing or eliminating such interfacial anomalies between a channel and a high-k dielectric, metal gates with their inherent advantages can be effectively included in the gate stack to provide further performance improvements. Accordingly, the capping layer enables compatible use of high-k dielectric materials as gate insulators with metal gate electrodes in high performance devices suitable for the 45 nm technology node and beyond.

FIGS. 1-14 illustrate schematically, in cross section, methods for forming a semiconductor device 100 having P-channel MOS (PMOS) and N-channel MOS (NMOS) transistors with capped gate channels in accordance with various exemplary embodiments of the invention. While the fabrication of portions of one NMOS and one PMOS transistor is illustrated, it will be appreciated that the method depicted in FIGS. 1-14 can be used to fabricate any number of such transistors. Various steps in the manufacture of MOS components are well known and so, in the interest of brevity, many conventional steps will only be mentioned briefly herein or will be omitted entirely without providing the well known process details.

Figure 1:
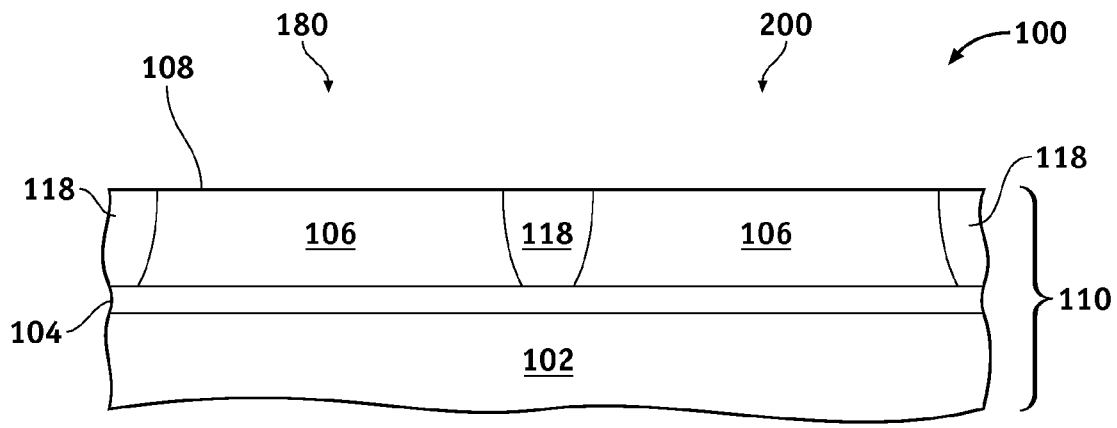
FIGS. 1-14 illustrate schematically, in cross-section, methods for fabricating a semiconductor device having a buried channel in accordance with an exemplary embodiment of the present invention.

Referring to FIG. 1, in accordance with an exemplary embodiment, the method begins by providing a semiconductor substrate 110. The semiconductor substrate can be silicon, germanium, a III-V material such as gallium arsenide, or another semiconductor material. Semiconductor substrate 110 will hereinafter be referred to for convenience, but without limitation, as a silicon substrate. The term "silicon substrate" is used herein to encompass the relatively pure silicon materials typically used in the semiconductor industry as well as silicon admixed with other elements such as germanium, carbon, and the like. The silicon substrate may be a bulk wafer comprising monocrystalline silicon or, as shown in FIG. 1, may be a thin layer 106 of monocrystalline silicon on an insulating layer 104 (commonly know as silicon-on-insulator, or SOI) that, in turn, is supported by a carrier wafer 102. The thickness of thin silicon layer 106 may vary depending on the intended application of semiconductor device 100, and in one embodiment is from about 80 nm to about 100 nm thick. Isolation regions 118 are formed that extend through thin silicon layer 106 to insulating layer 104. The isolation regions are preferably formed by well known shallow trench isolation (STI) techniques in which trenches are etched into thin silicon layer 106, the trenches are filled with a dielectric material such as deposited silicon oxide, and the excess silicon oxide is removed by chemical mechanical planarization (CMP). Isolation regions 118 are used to electrically isolate an NFET region 180 and a PFET region 200 upon which gate stacks for NFET and PFET transistors, respectively, are subsequently formed. At least a surface region 108 of silicon substrate 110 is impurity doped, for example by forming an N-type well region in PFET region 200 and a P-type well region in NFET region 180 for the fabrication of PFET and NFET transistors, respectively.

Figure 2:
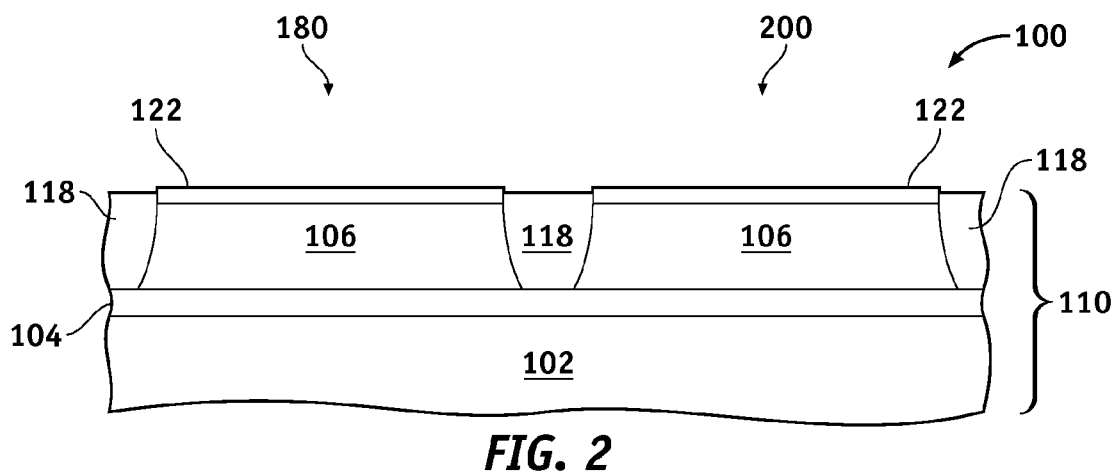

Next, a hard mask layer 122 is formed overlying NFET and PFET regions 180 and 200, as illustrated in FIG. 2. Hard mask layer 122 may comprise a thermally grown silicon dioxide or, alternatively, may comprise a deposited silicon oxide ($SiO_x$), silicon nitride ($Si_3N_4$), or silicon oxynitride (SiON), or another material suitable for providing masking protection during a subsequent epitaxial growth process. When a deposition process is used, hard mask layer 122 may be blanket-deposited, for example, by chemical vapor deposition (CVD), low pressure chemical vapor deposition (LPCVD), or plasma enhanced chemical vapor deposition (PECVD). For substrate 110 depicted in FIG. 2, preferably hard mask layer 122 is a thermally grown silicon dioxide that is formed at the surface of thin silicon layer 106, and has a thickness in a range of from about 7 nanometers (nm) to about 15 nm, and is preferably about 8 nm thick.

Figure 3:
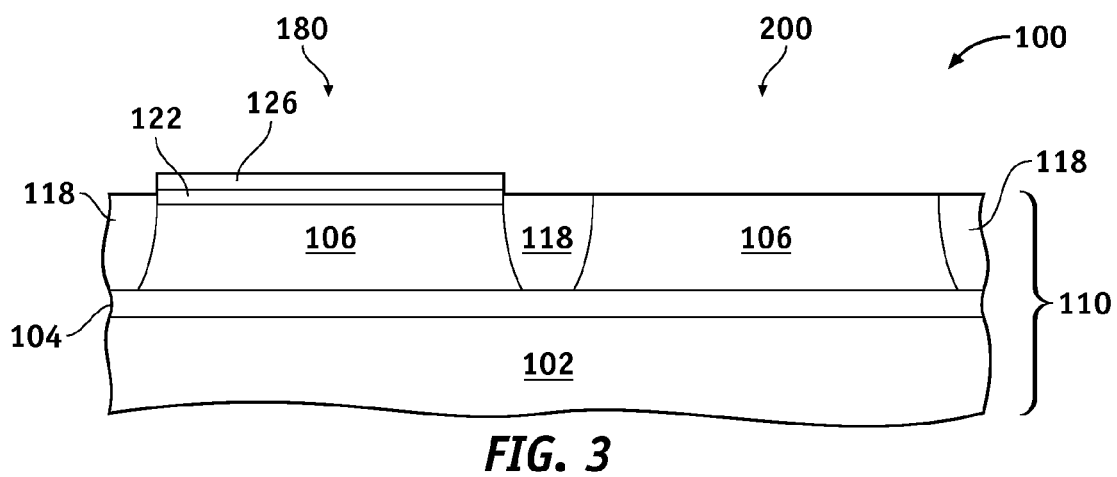

Hard mask layer 122 is patterned using a suitable lithography process that forms a photoresist mask 126 overlying NFET region 180, as illustrated in FIG. 3. A reactive ion etch (RIE) process then is used to remove hard mask layer 122 from PFET region 200. The RIE process chemistry used depends on the material selected for hard mask layer 122 and may be based on, for example, $CHF_3$, $CF_4$ or $SF_6$ for both silicon oxide/dioxide, or silicon nitride. Next, photoresist mask 126 is removed from NFET region 180 using an oxygen-based ashing process that may be combined with a suitable solvent-based photoresist removal process.

Figure 4:
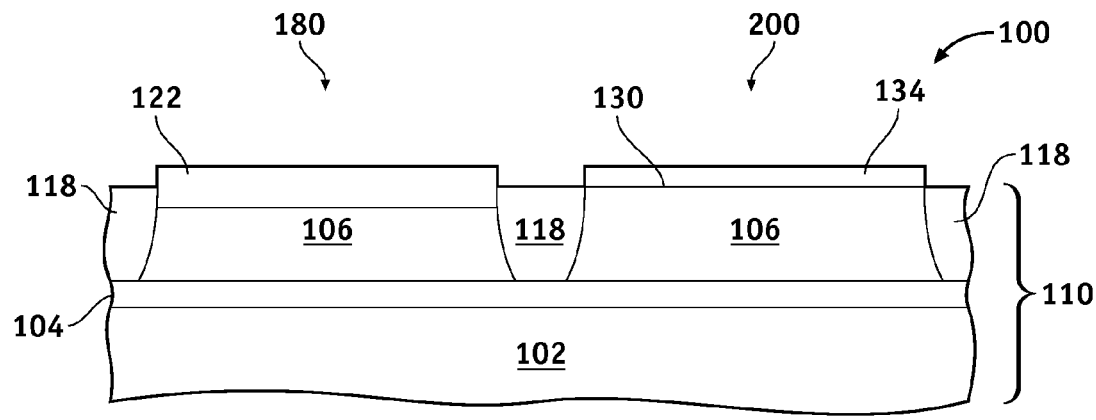

With patterned hard mask layer 122 in place to mask NFET region 180, a PFET channel layer 134 comprising a monocrystalline material is epitaxially grown on a silicon surface 130 of thin silicon layer 106 in PFET region 200, as illustrated in FIG. 4. The epitaxial process is performed selectively to silicon surfaces so that growth on non-silicon surfaces such as hard mask layer 122 is prevented. PFET channel layer 134 may comprise any compressively-stressed semiconductor material suitable for the channel of PFET devices such as, for example, silicon germanium (SiGe), germanium (Ge), or indium phosphide (InP), and preferably comprises SiGe. PFET channel layer 134 can be epitaxially grown by the reduction of silane (SiH$_4$) or dichlorosilane (SiH$_2$Cl$_2$) in the presence of hydrochloric acid (HCl) to control growth selectivity. Preferably, Ge is also added to the epitaxial growth reactants so that PFET channel layer 134 is formed as an SiGe layer having a compressive stress. The concentration of Ge incorporated into PFET channel layer 134 is in a range of from about 20% to about 40%, and is preferably about 25% Ge. Hard mask layer 122 then is removed using an RIE process selective to PFET channel layer 134.

Figure 5:
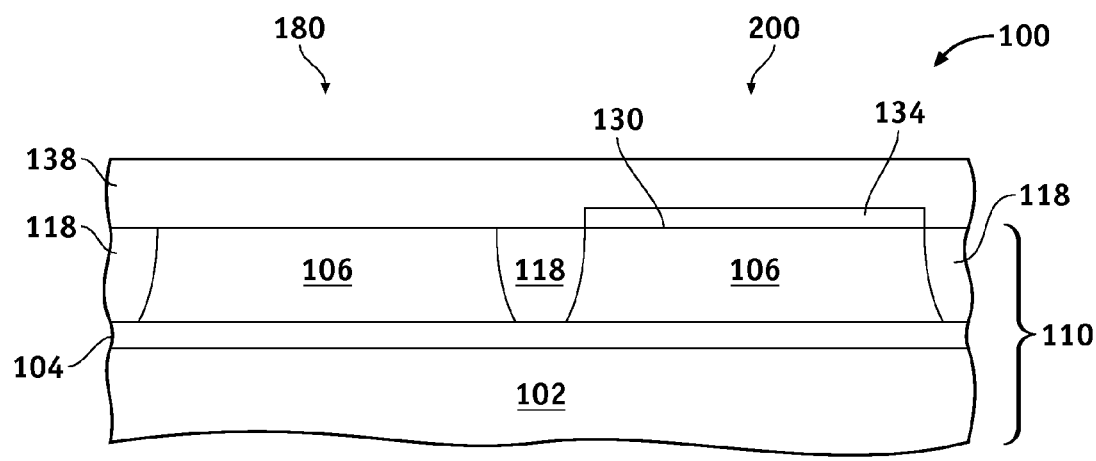
Figure 6:
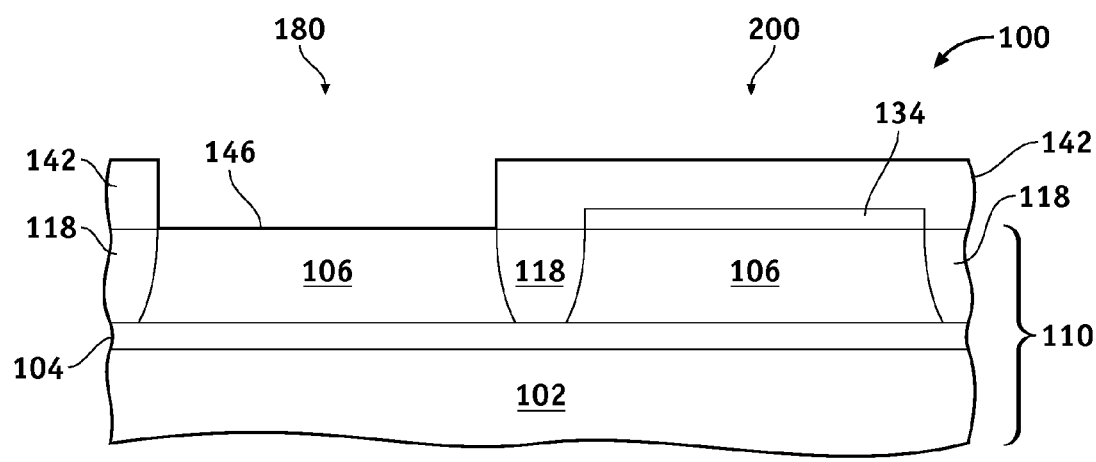

Referring to FIG. 5, a hard mask layer 138 is blanket-deposited overlying NFET and PFET regions 180 and 200, respectively, including PFET channel layer 134. Hard mask layer 138 may be formed using any of the deposition-based materials and processes previously described for hard mask layer 122. A hard mask 142 is then formed by removing a portion of hard mask layer 138 as illustrated in FIG. 6, using a lithographic and RIE patterning sequence. When formed, hard mask 142 overlays PFET channel layer 134 and isolation regions 118, protecting these regions from subsequent etch and epitaxial processes and leaving a silicon surface 146 within NFET region 180 exposed thereto.

Figure 7:
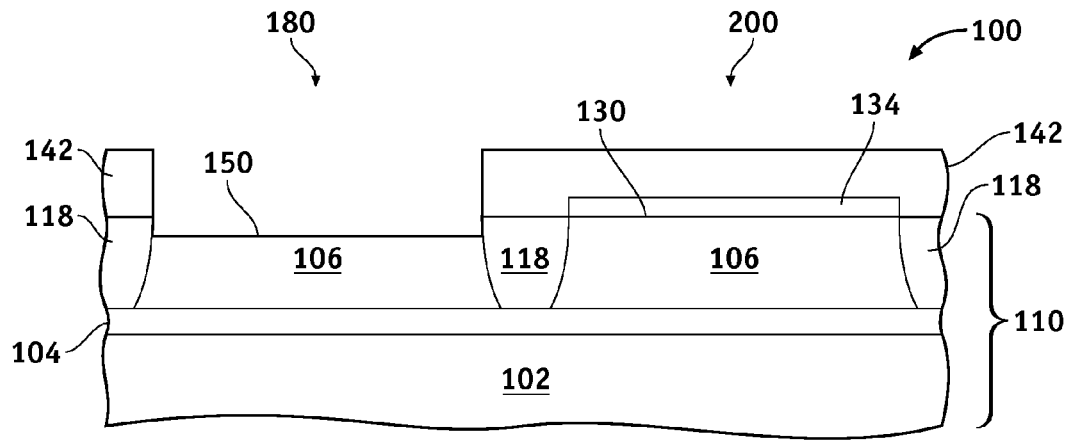
Figure 8:
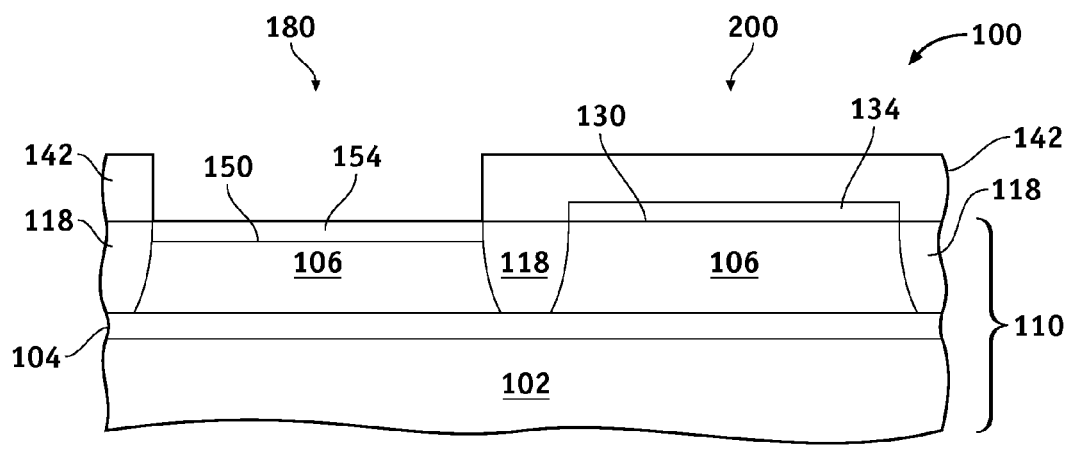
Figure 9:
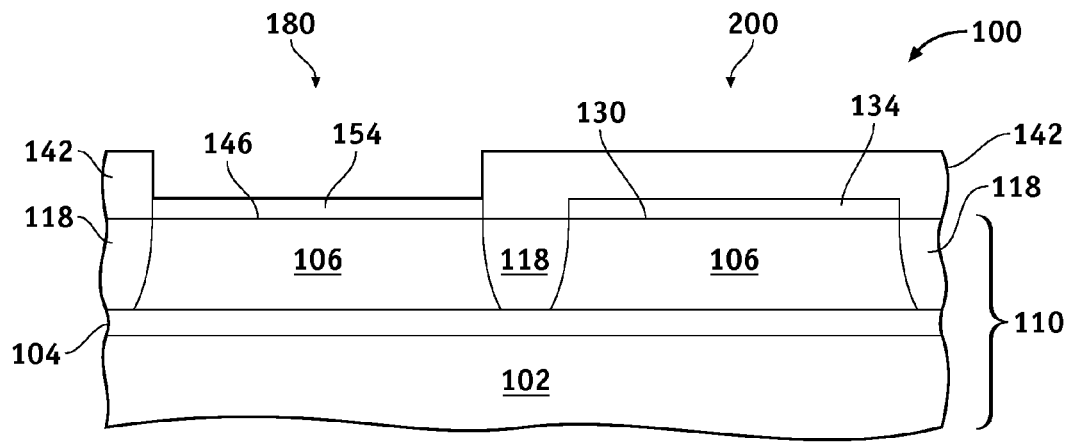

In one exemplary embodiment illustrated in FIG. 7, a recess 150 is anisotropically etched into thin silicon layer 106 of NFET region 180 using hard mask 142 as an etch mask. Recess 150 is not etched completely through thin silicon layer 106, leaving at least some silicon to nucleate the subsequent epitaxial growth, and may be etched with, for example, an RIE process using an HBr/O$_2$ chemistry. Next, referring to FIG. 8, an epitaxial stress-inducing layer 154 comprising a silicon-comprising monocrystalline material is epitaxially grown in recess 150 (FIG. 7) of NFET region 180. Stress-inducing layer 154 can be epitaxially grown using the process previously described for PFET channel layer 134 including the addition of Ge to epitaxial reactants to form a compressively stressed SiGe layer. In one embodiment, the concentration of Ge in stress-inducing layer 154 is within a range of from about 20% to about 40%, and is preferably about 25%. In another embodiment, the thickness of stress-inducing layer 154 is within a range of from about 5 nm to about 10 nm, and is preferably about 8 nm thick. The epitaxial process is performed selectively to silicon surfaces so that growth on non-silicon surfaces such as hard mask 142 is prevented. However, depending upon the selectivity of the etch process for recess 150, the thickness of hard mask layer 138 (FIG. 5) may require adjustment to ensure that hard mask 142 is sufficiently thick to provide masking for both the etch of recess 150 and the epitaxial growth processes. In an alternate embodiment illustrated in FIG. 9, without etching recess 150, stress-inducing layer 154 is epitaxially grown directly overlying silicon surface 146 of thin silicon layer 106 in NFET region 180 using hard mask 142 as an epitaxial growth mask. Stress-inducing layer 154 is grown using the same selective epitaxial process previously described to form a compressively stressed SiGe layer having a thickness range also described above.

Figure 10:
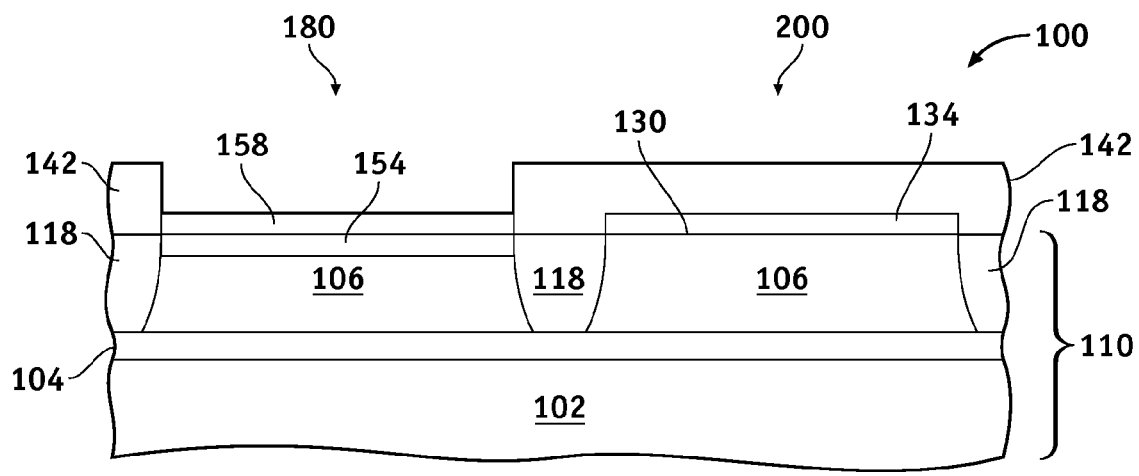

The method continues, as illustrated in FIG. 10, with the epitaxial growth of an NFET channel layer 158 comprising monocrystalline silicon overlying stress-inducing layer 154, whether formed within recess 150 or overlying silicon surface 146. NFET channel layer 158 is grown in a manner selective to monocrystalline silicon-comprising surfaces such as stress-inducing layer 154 to prevent formation on non-silicon surfaces such as hard mask 142. Because the lattice constant of NFET channel layer 158 formed of monocrystalline silicon is less than that of the underlying stress-inducing layer 154 comprised of SiGe, NFET channel layer 158 is epitaxially formed having a tensile stress imparted to it.

In another embodiment (not shown), after the formation of hard mask 142, as illustrated in FIG. 6, NFET channel layer 158 comprising silicon-carbon (SiC) is epitaxially grown directly overlying silicon surface 146 of thin silicon layer 106 in NFET region 180 using hard mask 142 as an epitaxial growth mask. An underlying stress-inducing layer is not needed to impart a tensile stress to epitaxial SiC because the lattice constant of this film is less than that of thin silicon layer 106. Accordingly, NFET channel layer 158 has a tensile stress imparted to it by the underlying thin silicon layer 106. In one embodiment, the epitaxial SiC material used for NFET channel layer 158 includes no more than about 3% carbon and preferably includes about 2% carbon. In another embodiment, NFET channel layer 158 comprises other epitaxially-grown semiconductor materials including gallium arsenide (GaAs), or indium gallium arsenide (InGaAs). Epitaxial layers grown using either of these materials will be compressively stressed when grown over thin silicon layer 106 because the lattice constant of either epitaxial GaAs or InGaAs is greater than that of silicon. However, the higher level of electron mobility inherent to either of these materials may make them viable as an alternative channel material for an NFET device.

Figure 11:
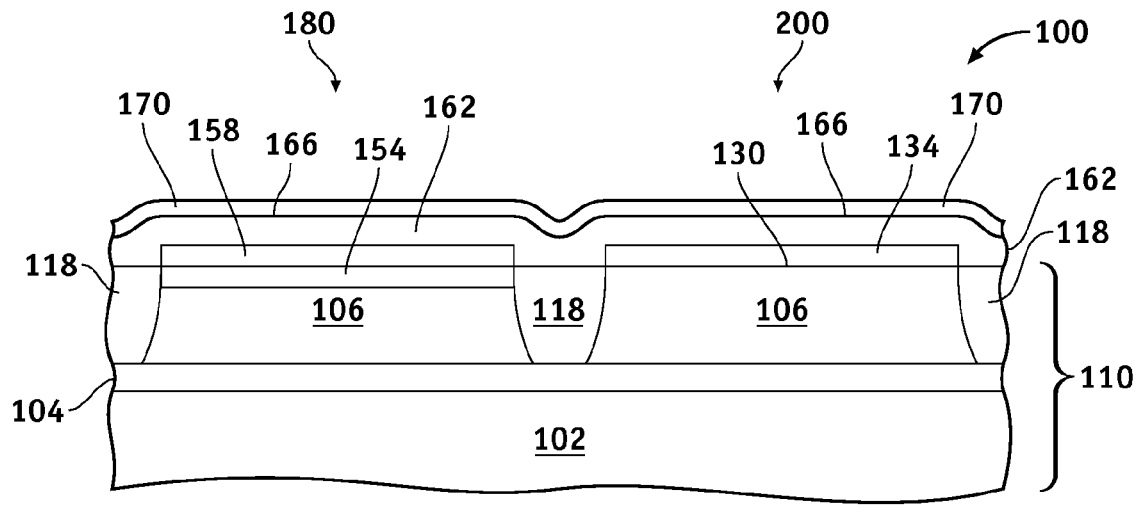

In one embodiment, hard mask 142 is removed using a wet or dry etch process selective to both PFET channel layer 134 and NFET channel layer 158. Following this, a channel capping layer 162 is blanket-deposited overlying PFET and NFET channel layers 134 and 158, respectively, and isolation regions 118, as illustrated in FIG. 11. Channel capping layer 162 comprises substantially pure silicon and may be deposited using a plasma vapor deposition (PVD) or CVD process, and has a thickness in a range of from about 1 nm to about 4 nm, and is preferably about 2.5 nm thick. An oxide surface layer 166 is then formed at the surface of channel capping layer 162 by exposure to ambient atmospheric oxygen and/or by using a suitable wet cleaning process that passivates the surface of channel capping layer 162 but does not remove silicon therefrom. For example, a "standard clean #1" (SC1) process that includes immersion for approximately 10 minutes in a bath comprising ammonium hydroxide, hydrogen peroxide, and water (NH$_4$OH/H$_2$O$_2$/H$_2$O), and/or a "standard clean #2" (SC2) process comprising immersion for approximately 10 minutes in a hydrochloric acid, hydrogen peroxide, and water (HCl/H$_2$O$_2$/H$_2$O) bath may be used. Oxide surface layer 166 has a thickness in a range of from about 0.5 nm to about 1.2 nm, and is preferably about 1 nm thick.

Next, a gate insulator layer 170 is blanket-deposited overlying oxide surface layer 166. Preferably, gate insulator layer 170 is formed of a deposited high dielectric constant (high-k) insulating material such as a hafnium oxide including hafnium silicon oxides (HfSi$_x$O$_y$), hafnium dioxide (HfO$_2$), and hafnium oxynitrides (HfO$_x$N$_y$), or hafnium silicon oxynitrides (HfSi$_x$O$_y$N$_z$), where x and y are each greater than zero, zinc dioxide (ZnO$_2$), or the like, and may be deposited, for example, by CVD, LPCVD, PECVD, physical vapor deposition, or atomic layer deposition (ALD). The material chosen for gate insulator layer 170 has a dielectric constant of greater than 7.0, and preferably is at least about 12.0. Gate insulator layer 170 preferably has a thickness of from about 1 nm to about 5 nm, although the actual thickness depends on the application of the transistor in the circuit being implemented.

Figure 12:
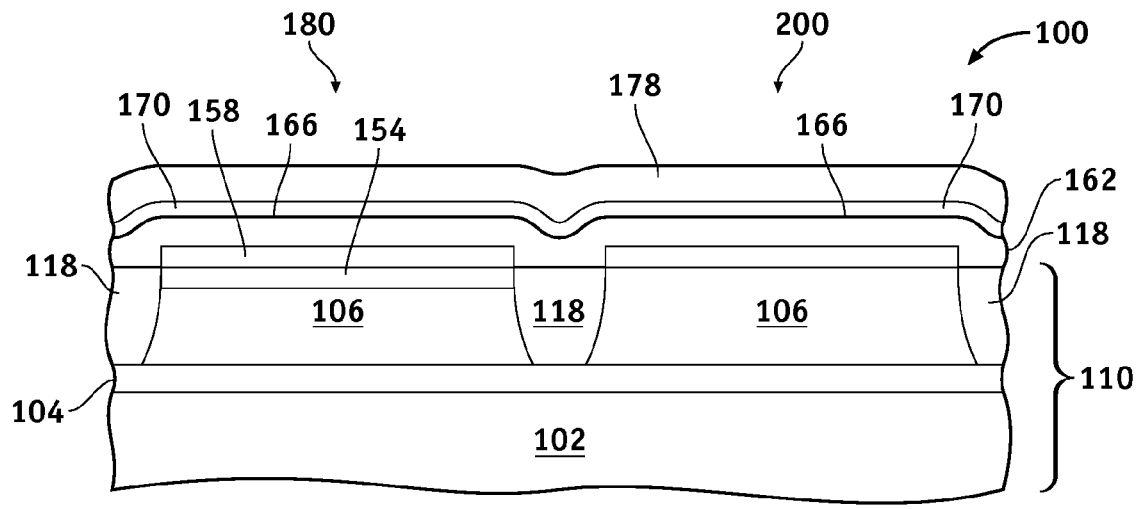
Figure 13:
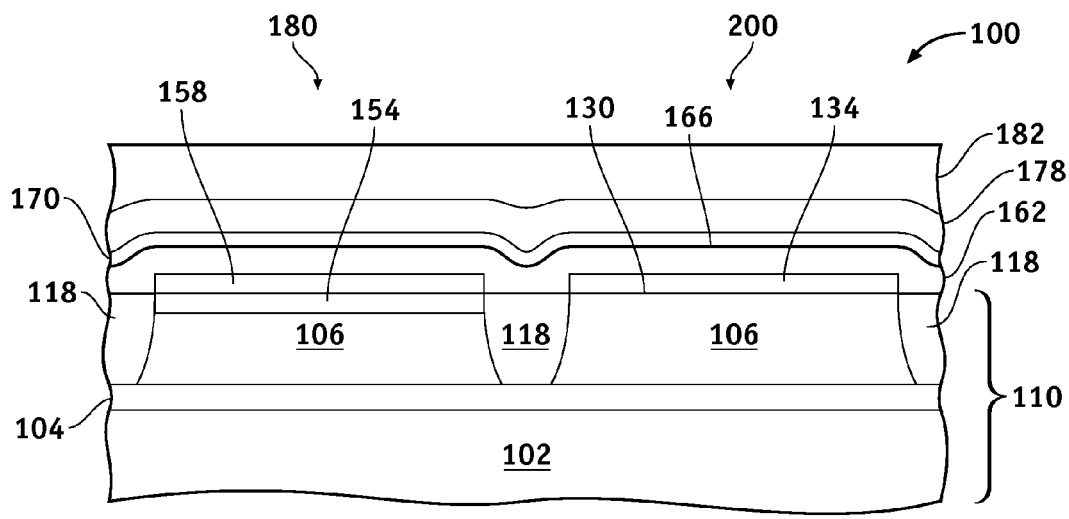
Figure 14:
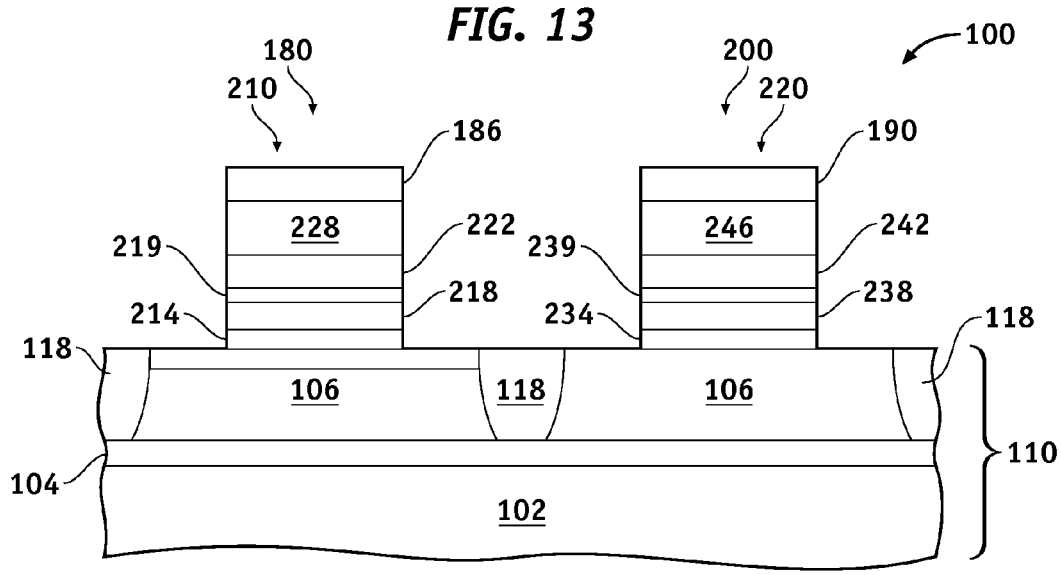

In one exemplary embodiment, illustrated in FIGS. 12-14, after formation of gate insulator layer 170, the method continues with the formation of a metal-comprising gate layer 178 overlying gate insulator layer 170 in each of NFET and PFET regions 180 and 200. Referring to FIG. 12, metal-comprising gate layer 178 may be formed of lanthanum (La)

or lanthanum alloys, aluminum (Al) or aluminum alloys, magnesium (Mg) or magnesium alloys, titanium-based materials such as titanium nitride (TiN) or titanium aluminum nitride (TiAlN), tantalum-based materials such as tantalum nitride (TaN), tantalum aluminum nitride (TaAlN), or tantalum carbide ($Ta_2C$), or tungsten nitride (WN), or the like, or a combination thereof, and is preferably La. Metal-comprising gate layer 178 preferably has a thickness of from about 0.5 nm to about 10 nm, and is preferably about 5 nm thick.

Referring to FIG. 13, a blanket-deposited hard mask layer 182 having a composition and thickness suitable for use as a hard mask is formed overlying metal-comprising gate layer 178. Exemplary materials that may be used for hard mask layer 182 include $Si_3N_4$, $SiO_2$, and TiN. Hard mask layer 182 is patterned using a lithographic and dry etch process sequence to form hard masks 186 and 190 overlying NFET and PFET regions 180 and 200, respectively, as illustrated in FIG. 14. Hard mask 186 is subsequently used as a hard etch mask for etching NFET channel layer 158, channel capping layer 162, oxide surface layer 166, gate insulator layer 170, and metal-comprising gate layer 178 to form a gate stack 210 overlying NFET region 180. Similarly, hard mask 190 is used as a hard etch mask for etching PFET channel layer 134, channel capping layer 162, oxide surface layer 166, gate insulator layer 170, and metal-comprising gate layer 178 to form a gate stack 220 overlying PFET region 200. Hard masks 186 and 190 and any remaining photoresist (not shown) then are removed. After such etching and removal, gate stack 210 comprises an NFET channel 214, an NFET channel cap 218, an NFET channel cap surface oxide 219, an NFET gate insulator 222, and an NFET gate electrode 228. Gate stack 220 comprises a PFET channel 234, a PFET channel cap 238, a PFET channel cap surface oxide 239, a PFET gate insulator 242, and a PFET gate electrode 246 having the same composition as NFET gate electrode 228.

Figure 15:
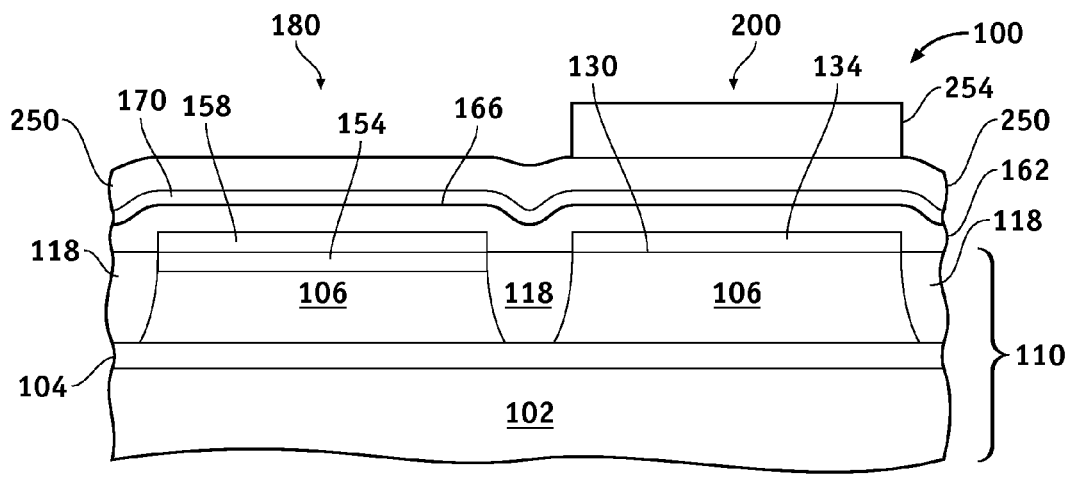
FIGS. 15-19, in conjunction with FIGS. 1-11, illustrate schematically, in cross-section, methods for fabricating a semiconductor device having a buried channel and having metal gate electrodes having different compositions in NFET and PFET devices in accordance with another exemplary embodiment.

In another exemplary embodiment illustrated in FIGS. 15-19, metal gate electrodes having different compositions are fabricated in each of regions 180 and 200. This method begins with steps that are illustrated in FIGS. 1-11 and previously described. Following the deposition of gate insulator layer 170 illustrated in FIG. 11, the method continues with the deposition of a metal-comprising gate layer 250 overlying gate insulator layer 170, as illustrated in FIG. 15. Metal-comprising gate layer 250 may be formed of any of the metal-based materials or any combination of metal-based materials previously described for metal-comprising gate layer 178, and preferably comprises TiN. Metal-comprising gate layer 250 preferably has a thickness of from about 0.5 nm to about 10 nm, and is preferably about 5 nm thick. Following the deposition of metal-comprising gate layer 250, a photoresist mask 254 is formed using a suitable lithography process overlying PFET region 200.

Figure 16:
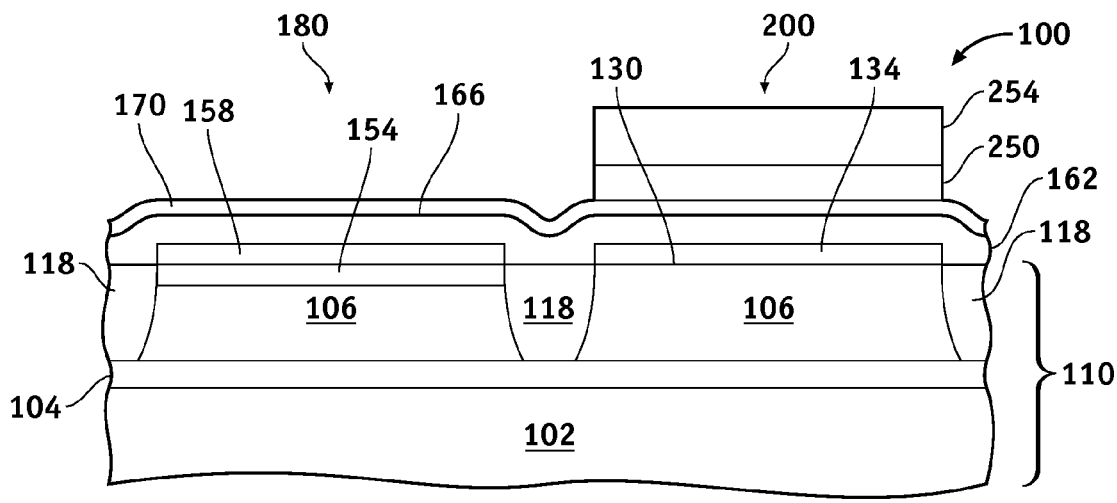

Next, an RIE or plasma etch process is used to remove portions of metal-comprising gate layer 250, as illustrated in FIG. 16, using photoresist mask 254 as an etch mask. The etch process is performed selectively so as not to erode gate insulator layer 170 in NFET region 180. The etch chemistry used will depend, in part, on the material composition to be etched, and may include, for example, a $Cl_2$/HBr chemistry for TiN, a $Cl_2/CF_4$ chemistry for TaN, or a $SF_6/CH_2F_2$ chemistry for WN. Photoresist mask 254 then is removed in a manner previously described.

Figure 17:
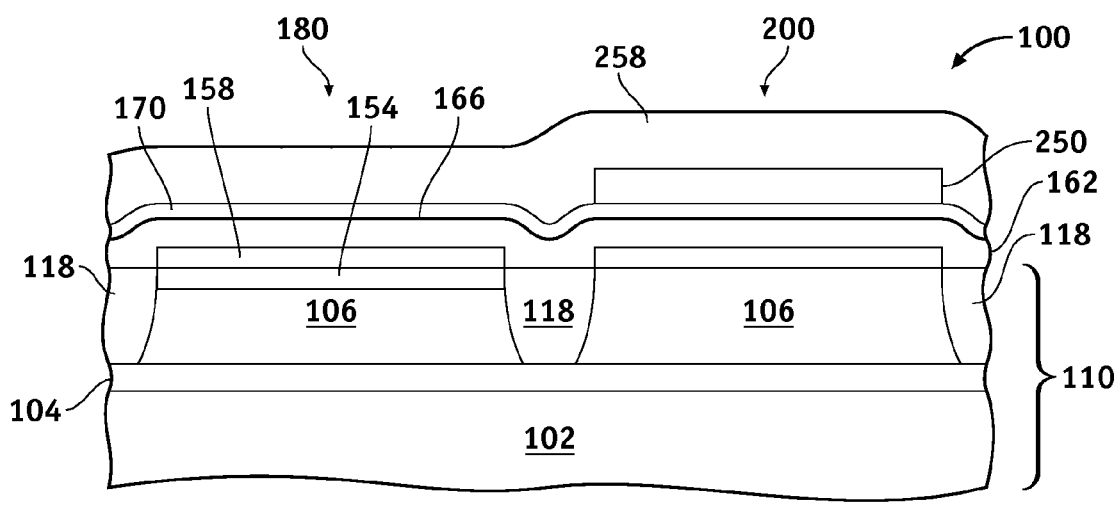

A metal-comprising gate layer 258, comprising a different composition from that of metal-comprising gate layer 250, then is blanket deposited overlying NFET and PFET regions 180 and 200 including metal-comprising gate layer 250 as illustrated in FIG. 17. Metal-comprising gate layer 258 may be deposited using any of the suitable metal deposition methods previously described, and has a thickness in a range of from about 0.5 nm to about 10 nm, and is preferably about 5 nm thick. Metal-comprising gate layer 258 may be formed of any of the metal-based materials or combination of metal-based materials previously described for metal-comprising gate layer 178, and preferably comprises La.

Figure 18:
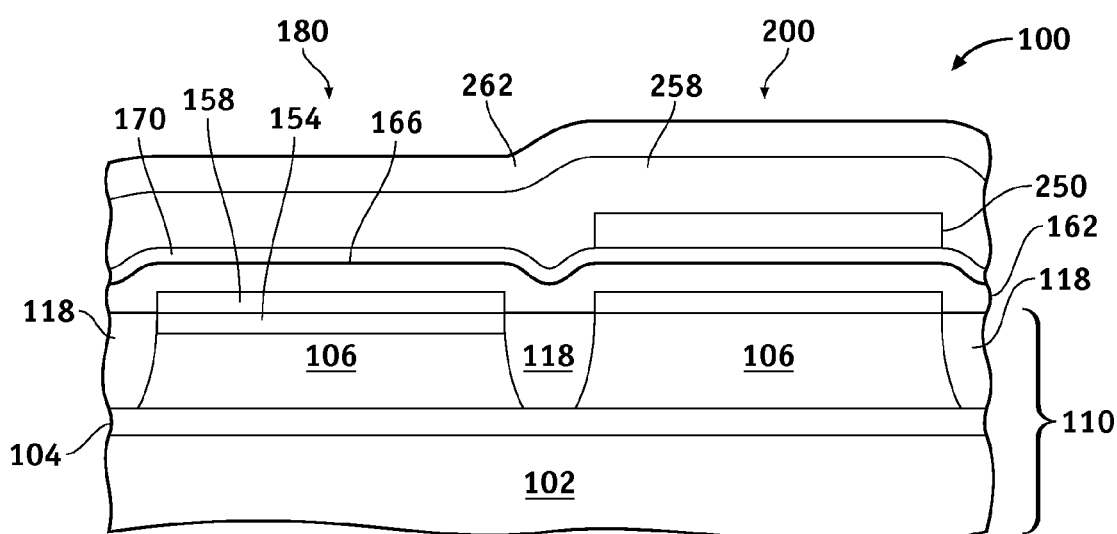
Figure 19:
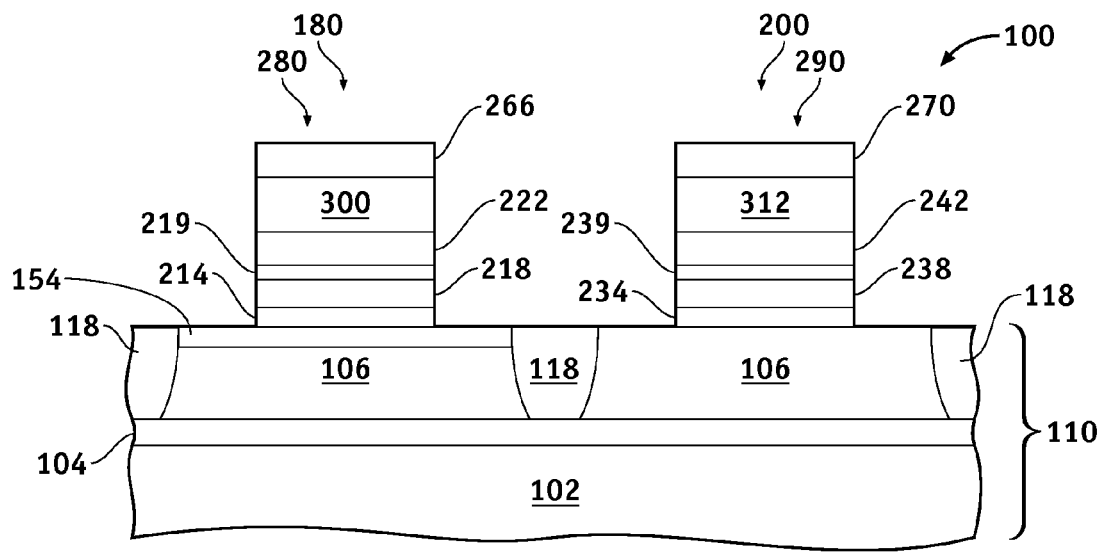

Referring to FIG. 18, a blanket deposited hard mask layer 262 comprising a composition and thickness suitable for use as a hard mask such as those previously described for hard mask layer 182 is formed overlying metal-comprising gate layer 258. Hard mask layer 262 then is patterned using a lithographic and dry etch process sequence to form hard masks 266 and 270 overlying NFET and PFET regions 180 and 200, respectively, as illustrated in FIG. 19. Hard mask 266 is subsequently used as a hard etch mask for etching NFET channel layer 158, channel capping layer 162, oxide surface layer 166, gate insulator layer 170, and metal-comprising gate layer 258, to form a gate stack 280 overlying NFET region 180. Similarly, hard mask 270 is used as a hard etch mask for etching PFET channel layer 134, channel capping layer 162, oxide surface layer 166, gate insulator layer 170, metal-comprising gate layer 250, and metal-comprising gate layer 258 to form a gate stack 290 overlying PFET region 200. Hard masks 266 and 270 and any remaining photoresist (not shown) then are removed. After such etching and removal, gate stack 280 comprises NFET channel 214, NFET channel cap 218, NFET channel cap surface oxide 219, NFET gate insulator 222, and an NFET gate electrode 300. Gate stack 290 comprises PFET channel 234, PFET channel cap 238, PFET channel cap surface oxide 239, PFET gate insulator 242, and a PFET gate electrode 312.

Figure 20:
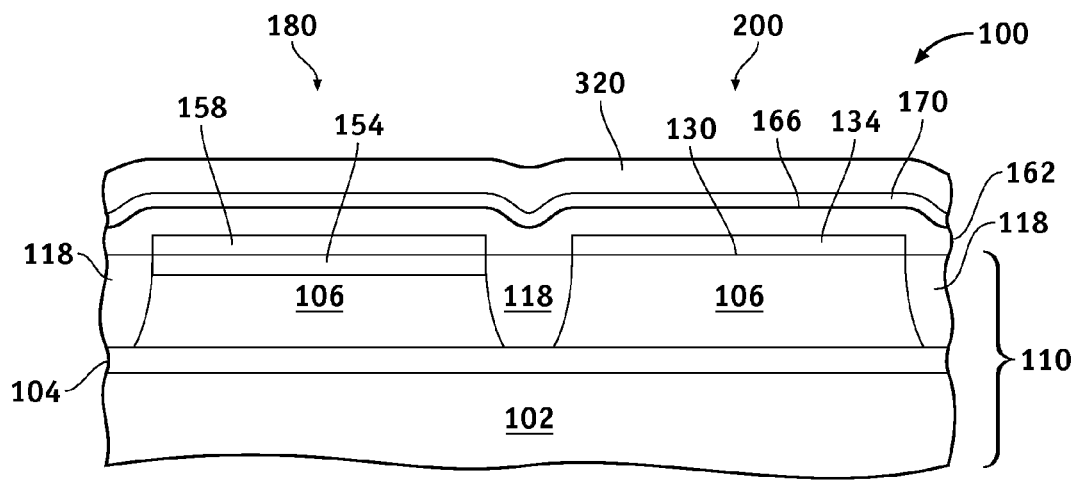
FIGS. 20-21, in conjunction with FIGS. 1-11, illustrate schematically, in cross-section, methods for fabricating a semiconductor device having a buried channel and having metal gate caps with like composition and metal gate electrodes with like composition in NFET and PFET devices in accordance with yet another exemplary embodiment.
Figure 21:
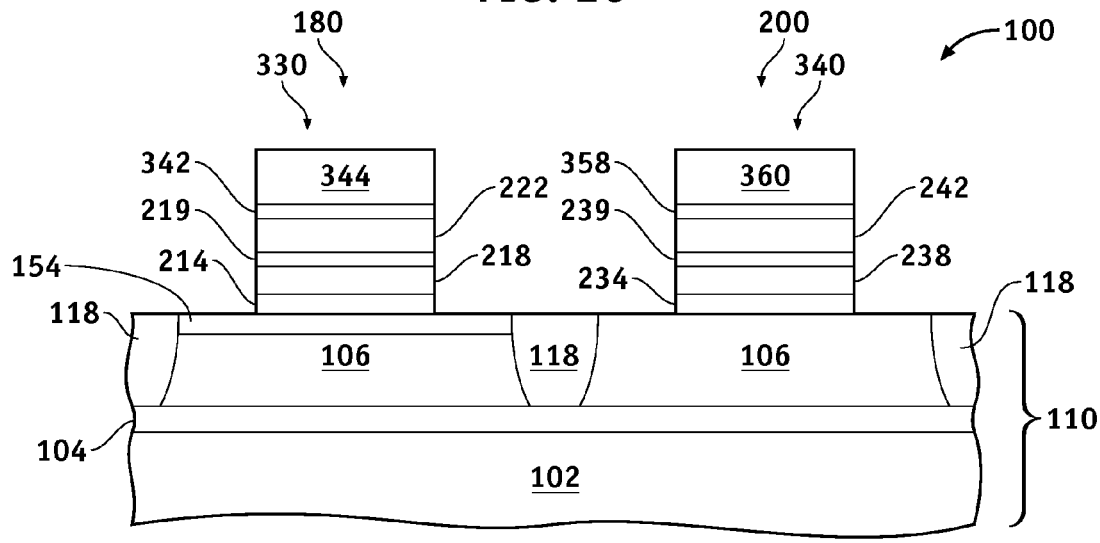
Figure 22:
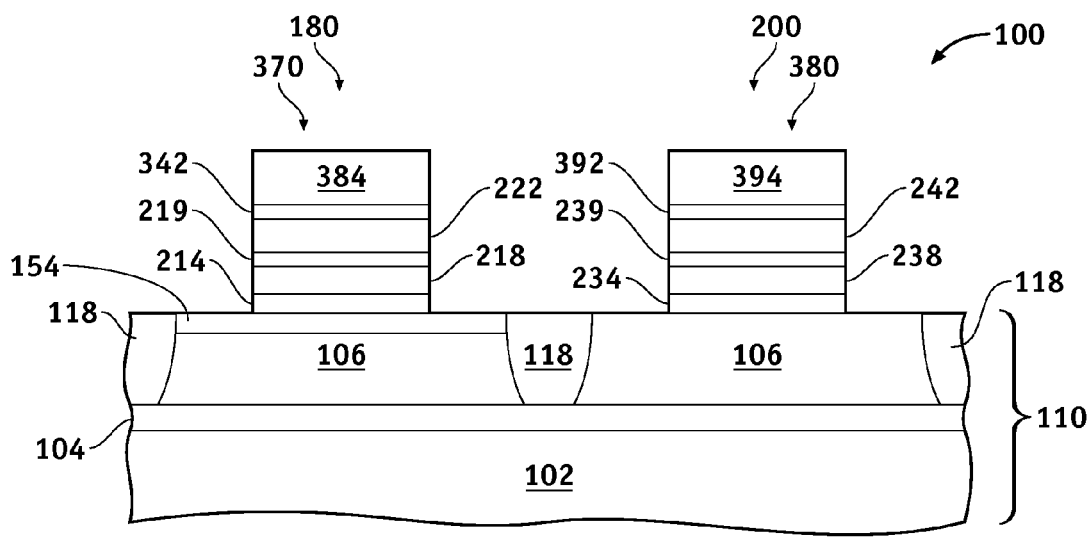
FIG. 22, in conjunction with FIGS. 1-11 and 20, illustrates schematically, in cross-section, methods for fabricating a semiconductor device having a buried channel and having metal gate caps of like composition and metal gate electrodes with different compositions in NFET and PFET devices in accordance with yet another exemplary embodiment.

In another exemplary embodiment illustrated in FIGS. 20-22, NFET and PFET gate stacks are formed having gate capping layers of like composition. This embodiment may be used when it is desirable to adjust the threshold voltages of each device type by a pre-determined amount. This method begins with steps that have been previously described and are illustrated in FIGS. 1-11. Following the deposition of gate insulator layer 170 illustrated in FIG. 11, the method continues with a gate capping layer 320 blanket-deposited overlying NFET and PFET regions 180 and 200 as illustrated in FIG. 20. Gate capping layer 320 may comprise any one or a combination of metal oxides, and/or metal oxynitrides, such as lanthanum oxides ($LaO_x$) and lanthanum oxynitrides ($LaO_xN_y$), hafnium oxides ($HfO_x$) and hafnium oxynitrides ($HfO_xN_y$), zirconium oxides ($ZrO_x$) and zirconium oxynitrides ($ZrO_xN_y$), magnesium oxides ($MgO_x$) and magnesium oxynitrides ($MgO_xN_y$), aluminum oxides ($AlO_x$) and aluminum oxynitrides ($AlO_xN_y$), titanium oxides ($TiO_x$) and titanium oxynitrides ($TiO_xN_y$), tantalum oxides ($TaO_x$) and tantalum oxynitrides ($TaO_xN_y$), and yttrium oxides ($YO_x$) and yttrium oxynitrides ($YO_xN_y$), where x and y are each greater than zero. Gate capping layer 320 may be deposited using any suitable deposition technique such as, for example, ALD, PVD, CVD, PECVD or LPCVD, and preferably is deposited by ALD. Gate capping layer 320 may also be formed as a self-assembling or self-assembled monolayer (SAM) using a chemical compound suitable for such a formation. Such a compound typically comprises a molecular structure suitably functionalized for adhesive attraction or bonding to molecular sites of a substrate surface, but lacking a propensity to form films that exceed monolayer thicknesses. For this application, a suitable SAM material includes, for example, a metal oxide and/or metal oxynitride-comprising molecular structure that inhibits a subsequently formed metallic gate electrode from interacting with a high-k dielectric insulator in a manner that reduces the insulating capacity of the high-k material. SAM compounds may be deposited via casting from a suitable solvent using, for example, a spin coating or dipping process. The thickness of gate capping layer 320 is in a range of from about 0.1 nm to about 1 nm and is preferably about 0.2 nm to about 0.4 nm thick. When formed, gate capping layer 320 provides a uniform film, having a substantially monolayer structure overlying gate insulator layer 170.

Depending on the intended application of semiconductor device 100, metal gate electrode layers having the same or different compositions may be formed overlying gate capping layer 320 in NFET and PFET regions 180 and 200. Methods for fabricating a metal gate layer of like composition in both regions have been previously described and are illustrated in FIGS. 12-14. These methods result in a gate stack 330 in NFET region 180 and a gate stack 340 in PFET region 200 as illustrated in FIG. 21. Gate stack 330 comprises NFET channel 214, NFET channel cap 218, NFET channel cap surface oxide 219, NFET gate insulator 222, an NFET gate cap 342, and an NFET gate electrode 344. Gate stack 340 comprises PFET channel 234, PFET channel cap 238, PFET channel cap surface oxide 239, PFET gate insulator 242, a PFET gate cap 358 having the same composition as NFET gate cap 342, and a PFET gate electrode 360 having the same composition as NFET gate electrode 344.

Methods for fabricating metal gate layers having different compositions in each of regions 180 and 200 have also been previously described and are illustrated in FIGS. 15-19. These methods result in a gate stack 370 in NFET region 180 and a gate stack 380 in PFET region 200 as illustrated in FIG. 22. Gate stack 370 comprises NFET channel 214, NFET channel cap 218, NFET channel cap surface oxide 219, NFET gate insulator 222, NFET gate cap 342, and an NFET gate electrode 384. Gate stack 380 comprises PFET channel 234, PFET channel cap 238, PFET channel cap surface oxide 239, PFET gate insulator 242, a PFET gate cap 392 having a different composition than NFET gate cap 342, and a PFET gate electrode 394.

Figure 23:
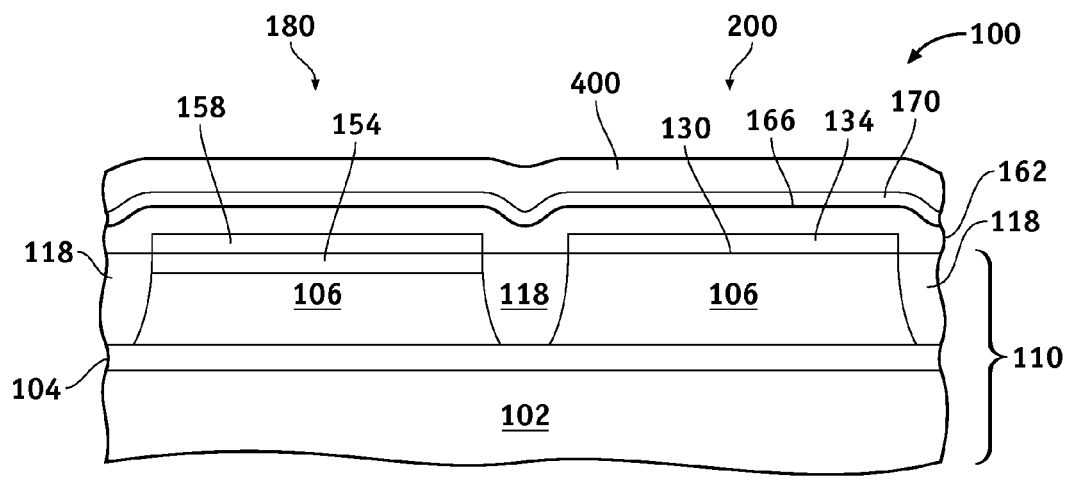
FIGS. 23-28, in conjunction with FIGS. 1-11 and 12-13, illustrate schematically, in cross-section, methods for fabricating a semiconductor device having a buried channel and having metal gate caps of different composition and metal gate electrodes of like composition in NFET and PFET devices in accordance with yet another exemplary embodiment.
Figure 24:
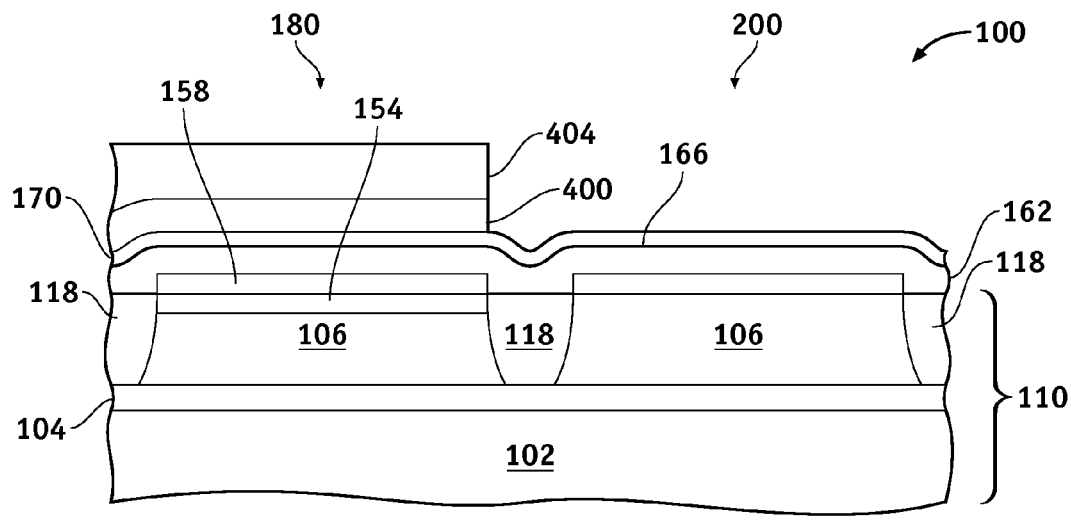

In yet a further embodiment illustrated in FIGS. 23-29, semiconductor device 100 is fabricated using gate capping layers of different composition in each of NFET region 180 and PFET region 200. This embodiment may be used to enhance overall device performance such as, for example, when it is desirable to set the threshold voltages for each device type at different levels. This method begins with steps that have been previously described and are illustrated in FIGS. 1-11. Following the deposition of gate insulator layer 170 as illustrated in FIG. 11, the method continues as illustrated in FIG. 23 with the blanket deposition of a gate capping layer 400 overlying layer 170. Gate capping layer 400 is masked in NFET region 180 by a photoresist mask 404 formed using any suitable photolithography process, as illustrated in FIG. 24. Gate capping layer 400 is then selectively removed from PFET region 200, using a suitable wet or dry etch process that does not erode the high-k dielectric of gate insulator layer 170. Following this etch, photoresist mask 404 is removed.

Figure 25:
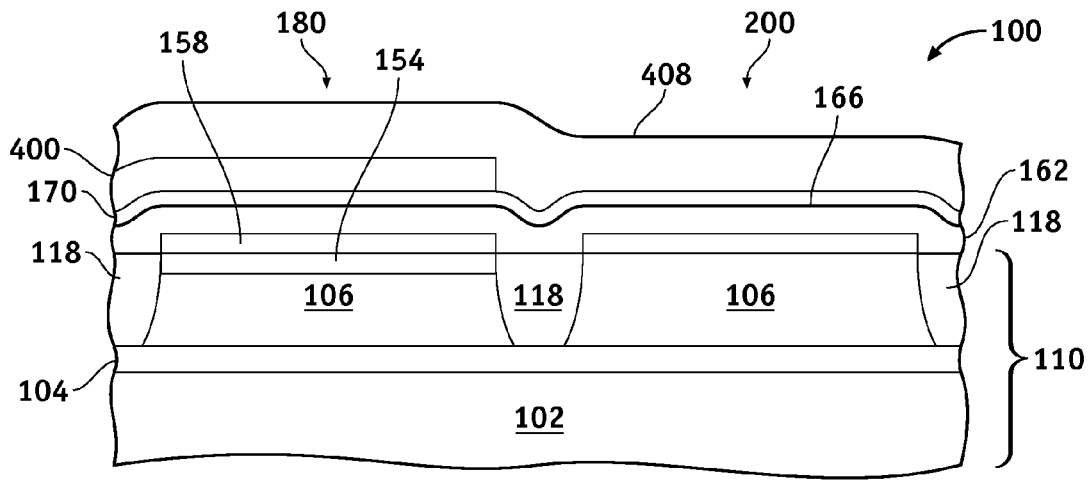
Figure 26:
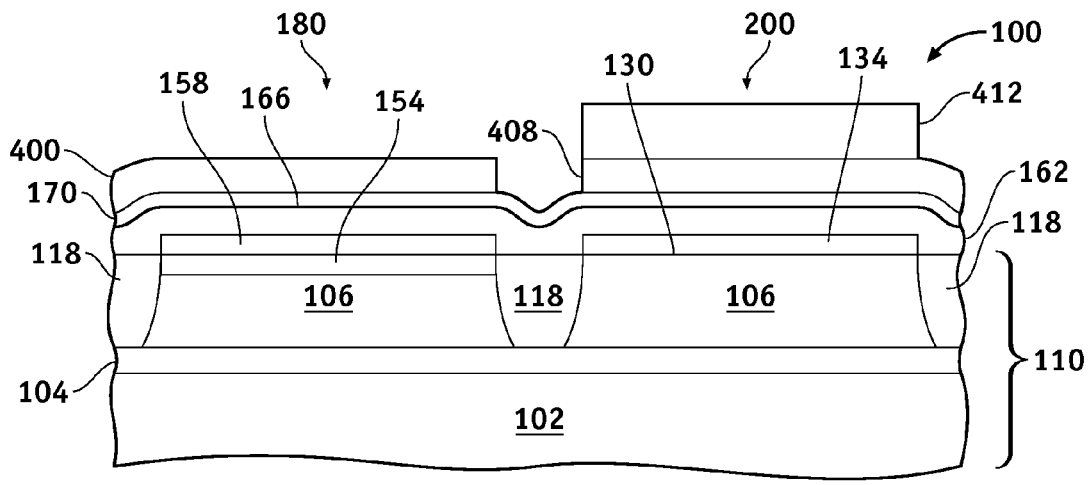
Figure 27:
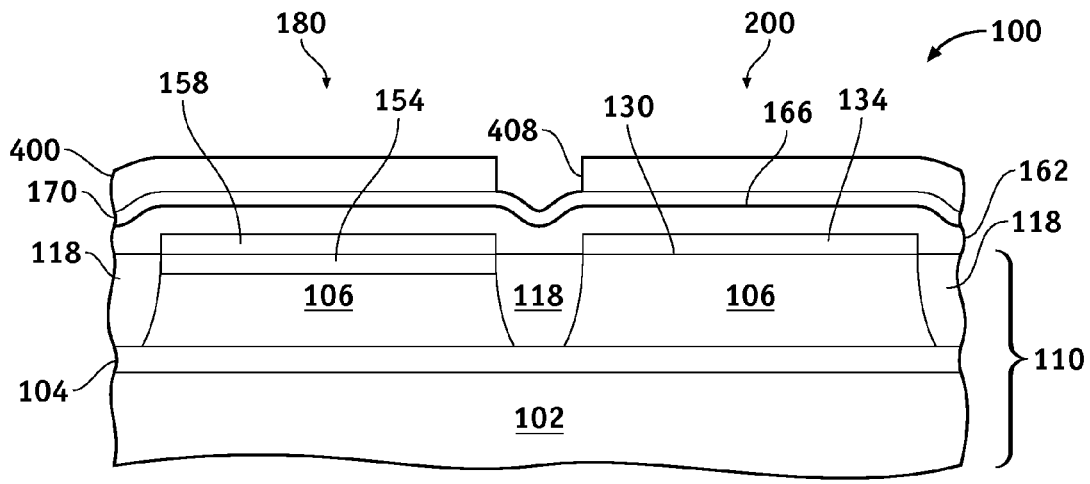

The method continues with the blanket-deposition of a gate capping layer 408 overlying NFET and PFET regions 180 and 200, as shown in FIG. 25. Gate capping layer 408 may comprise any one or a combination of the metal oxide and/or metal oxynitride materials previously described for gate capping layer 400, but has a composition different from that of gate capping layer 400. Gate capping layer 408 may be deposited to a thickness ranging from about 0.1 nm to about 1 nm, and preferably to about 0.2 nm to about 0.4 nm thick, using any of the deposition methods discussed above for gate capping layer 400. A photoresist mask 412 then is formed overlying gate capping layer 408 in PFET region 200 using a suitable lithography process, as shown in FIG. 26. The unmasked portion of gate capping layer 408 is removed using a suitable wet or dry etch process highly selective to both gate insulator layer 170 and gate capping layer 400. Following this etch, photoresist mask 412 is removed, as illustrated in FIG. 27.

Figure 28:
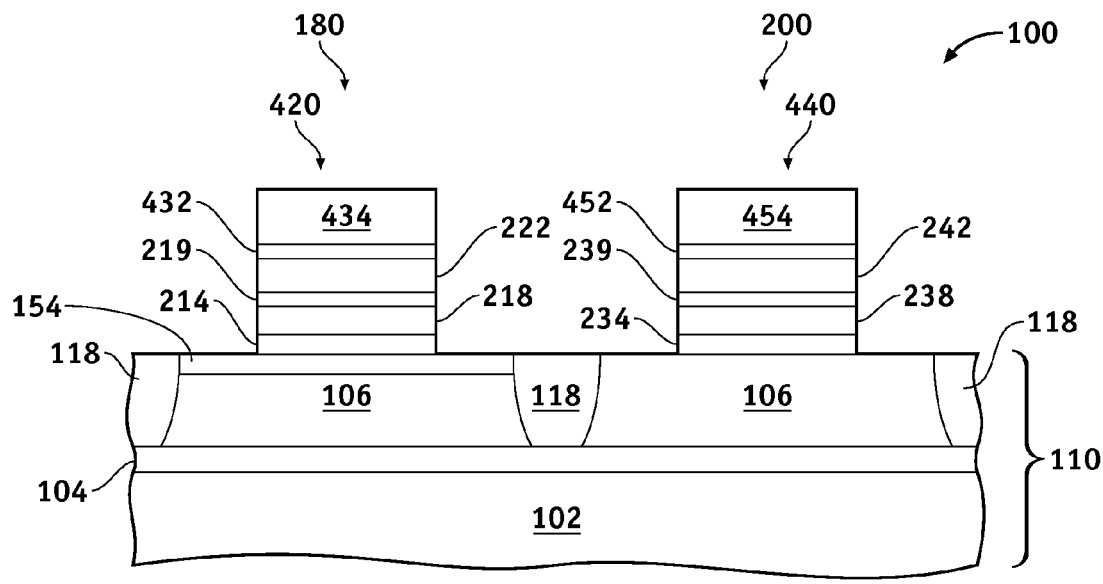

Metal gate electrode layers next are formed overlying NFET and PFET regions 180 and 200 including overlying gate capping layers 400 and 408, respectively. As described for previous embodiments, gate electrode layers may have the same or differing compositions in each region depending upon the intended application for semiconductor device 100. For the case wherein the gate electrode layer has the same composition in both regions 180 and 200, the method continues as previously described and illustrated in FIGS. 12-13. These methods result in a gate stack 420 in NFET region 180 and a gate stack 440 in PFET region 200 as illustrated in FIG. 28. Gate stack 420 comprises NFET channel 214, NFET channel cap 218, NFET channel cap surface oxide 219, NFET gate insulator 222, an NFET gate cap 432, and an NFET gate electrode 434. Gate stack 440 comprises PFET channel 234, PFET channel cap 238, PFET channel cap surface oxide 239, PFET gate insulator 242, a PFET gate cap 452 having a different composition than NFET gate cap 432, and a PFET gate electrode 454 having the same composition as NFET gate electrode 434.

Figure 29:
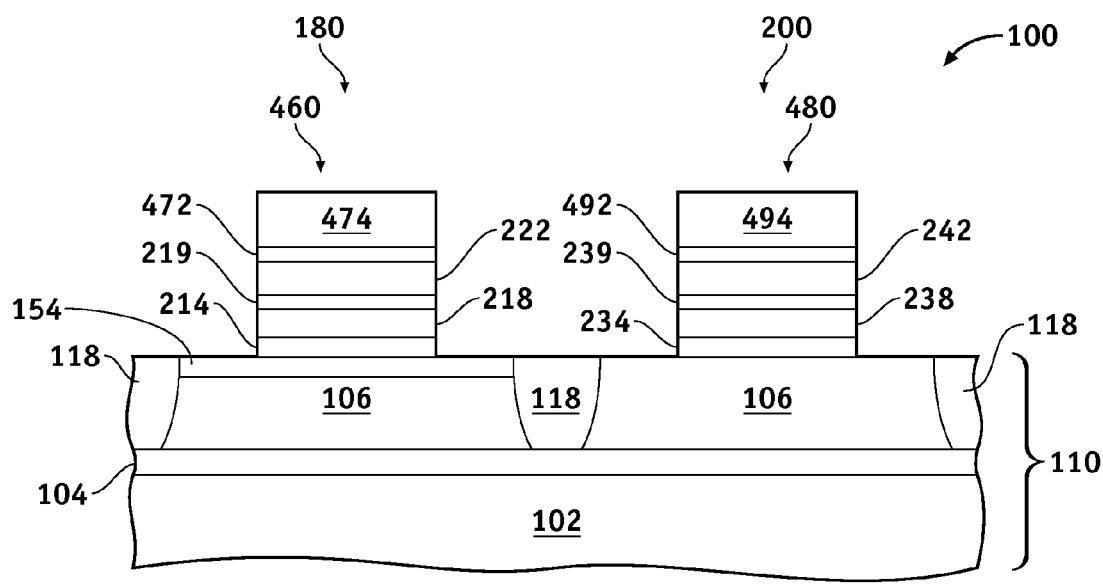
FIG. 29 in conjunction with FIGS. 1-11 and FIGS. 15-18, illustrates schematically, in cross-section, methods for fabricating a semiconductor device having a buried channel and having metal gate caps with different compositions and metal gate electrodes with different compositions in NFET and PFET devices in accordance with yet another exemplary embodiment.

For the case wherein gate electrode layers having different compositions are fabricated for each of regions 180 and 200, the method continues as previously described and illustrated in FIGS. 15-18. These methods result in a gate stack 460 in NFET region 180 and a gate stack 480 in PFET region 200 as illustrated in FIG. 29. Gate stack 460 comprises NFET channel 214, NFET channel cap 218, NFET channel cap surface oxide 219, NFET gate insulator 222, an NFET gate cap 472, and an NFET gate electrode 474. Gate stack 480 comprises PFET channel 234, PFET channel cap 238, PFET channel cap surface oxide 239, PFET gate insulator 242, a PFET gate cap 492 having a different composition than NFET gate cap 472, and a PFET gate electrode 494 having a different composition than NFET gate electrode 474.

Accordingly, the embodiments described herein provide novel methods for fabricating a semiconductor device having a buried channel by incorporating a silicon-comprising capping layer interposed between the channel and a high-k dielectric gate insulator. By burying the channel below the gate insulator, the capping layer separates the insulator and the channel and thereby reduces undesirable interfacial effects such as charge trapping and charge scattering that can adversely affect $V_t$ and degrade carrier mobility within the channel. A reduction of these potentially harmful effects, therefore, enhances the performance of devices having high-k dielectric gate insulators enabling their combined use with metal gate electrodes. This combination has been shown to provide performance benefits including a higher drive current, a more stable $V_t$, and the potential for further scalability of devices down to the 45 nm node and beyond. Accordingly, these methods may be used in combination to fabricate PFET and NFET transistors on CMOS devices, or to fabricate individual PFET and NFET devices, and can be integrated into a conventional fabrication sequence to provide improved device performance.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a semiconductor device comprising a semiconductor substrate, wherein the method comprises the steps of:
    forming a channel layer overlying the semiconductor substrate;
    forming a channel capping layer overlying the channel layer, the channel capping layer having a first exposed surface;
    oxidizing the first exposed surface of the channel capping layer; and
    depositing a high-k dielectric layer overlying the channel capping layer, wherein the semiconductor device is an NFET device, and wherein the step of forming the channel layer comprises forming a monocrystalline silicon channel layer, and the method further comprising the step of forming a compressively-stressed layer interposed between the semiconductor substrate and the channel layer.

2. The method of claim 1, wherein the step of forming the channel layer comprises forming the channel layer comprising a material selected from a group consisting of silicon, SiC, GaAs, InGaAs, SiGe, InP, and Ge.

3. The method of claim 1, wherein the step of forming the channel capping layer comprises forming the channel capping layer comprising silicon.

4. The method of claim 1, wherein the step of forming the channel capping layer comprises forming the channel capping layer having a thickness of from about 1 nm to about 4 nm.

5. The method of claim 1, wherein the step of depositing the high-k dielectric layer comprises depositing the high-k dielectric layer having a dielectric constant greater than about 7.

6. The method of claim 1, further comprising the step of forming a gate capping layer overlying the dielectric layer.

7. The method of claim 6, wherein the step of forming the gate capping layer comprises forming the gate capping layer having a composition selected from a group consisting of lanthanum oxides and oxynitrides, hafnium oxides and oxynitrides, zirconium oxides and oxynitrides, magnesium oxides and oxynitrides, aluminum oxides and oxynitrides, titanium oxides and oxynitrides, tantalum oxides and oxynitrides, yttrium oxides and oxynitrides, and a combination thereof.

8. The method of claim 6, further comprising the step of forming a metal-comprising gate electrode layer overlying the gate capping layer.

9. A method for forming a semiconductor device comprising a semiconductor substrate, wherein the method comprises the steps of:
    forming a channel layer overlying the semiconductor substrate;
    forming a channel capping layer overlying the channel layer, the channel capping layer having a first exposed surface;
    oxidizing the first exposed surface of the channel capping layer; and
    depositing a high-k dielectric layer overlying the channel capping layer, wherein the semiconductor substrate further comprises a first outer surface, and the method further comprising the step of forming a recess in the first outer surface of the semiconductor substrate and wherein the step of forming the channel layer comprises forming the channel layer in the recess.

10. A method of fabricating a semiconductor device on a semiconductor substrate having a first region and a second region, the method comprising the steps of:
    forming a first semiconductor layer overlying the first region;
    forming a compressively-stressed semiconductor layer overlying the second region;
    forming a channel capping layer overlying the first region and the second region, the channel capping layer having a first exposed surface;
    oxidizing the first exposed surface of the channel capping layer;
    depositing a high-k gate insulator layer overlying the channel capping layer; and
    forming a first gate capping layer overlying the high-k gate insulator layer in the first region, and a second gate capping layer overlying the high-k gate insulator layer in the second region.

11. The method of claim 10, wherein the semiconductor substrate comprises a first outer surface in the first region, and the method further comprising the step of forming a recess in the first outer surface of the semiconductor substrate in the first region, wherein the step of forming the first semiconductor layer comprises forming the first semiconductor layer in the recess.

12. The method of claim 10, wherein the step of forming a first semiconductor layer comprises forming the first semiconductor layer having a composition selected from a group consisting of silicon, InGaAs, GaAs, and SiC.

13. The method of claim 10, wherein the step of forming the compressively-stressed semiconductor layer comprises forming the compressively-stressed semiconductor layer having a composition selected from a group consisting of SiGe, Ge, and InP.

14. The method of claim 10, wherein the step of forming the channel capping layer comprises forming the channel capping layer comprising silicon.

15. The method of claim 10, wherein the first gate capping layer has a composition different from that of the second gate capping layer.

16. The method of claim 10, further comprising the step of forming a first metal-comprising gate layer overlying the first gate capping layer in the first region, and a second metal-comprising gate layer overlying the second gate capping layer in the second region.

17. The method of claim 16, wherein the first metal-comprising gate layer has a composition different from that of the second metal-comprising gate layer.

* * * * *